United States Patent [19]
Araki et al.

[11] Patent Number: 5,946,361
[45] Date of Patent: Aug. 31, 1999

[54] VITERBI DECODING METHOD AND CIRCUIT WITH ACCELERATED BACK-TRACING AND EFFICIENT PATH METRIC CALCULATION

[75] Inventors: Satoru Araki; Yoshihito Shimazaki; Shigeru Ono, all of Tokyo, Japan

[73] Assignee: Oki Electric Industry Co., Ltd., Tokyo, Japan

[21] Appl. No.: 08/489,933

[22] Filed: Jun. 13, 1995

[30] Foreign Application Priority Data

Jun. 23, 1994 [JP] Japan ................................. 6-141480

[51] Int. Cl.⁶ ............................ H04L 27/06; G06F 11/10
[52] U.S. Cl. ........................................... 375/341; 371/43.7
[58] Field of Search .................................. 375/262, 265, 375/341; 371/43

[56] References Cited

U.S. PATENT DOCUMENTS 5,375,129 12/1994 Cooper ...................................... 371/43

OTHER PUBLICATIONS

Imai, Fugo Riron (Coding Theory), Institute of Electronics, Information, and Communication Engineers of Japan, pp. 286 and 287, Mar. 15, 1990.

"Bei TI–sha no Keitai Denwa–yo DSP, Bitabi Fukugoka–yo Kairo wo Naizo" (TI puts Viterbi decoding circuit in DSP for portable telephones), Nikkei Electronics, Feb. 28, 1994, pp. 15–16.

Primary Examiner—Stephen Chin
Assistant Examiner—Kevin Kim
Attorney, Agent, or Firm—Rabin & Champagne, P.C.

[57] ABSTRACT

In a first aspect of the invention, a Viterbi decoding circuit stores comparison result bits in a bit-accessible path memory unit. A back-trace is performed by setting a state value in a shift register, then shifting comparison result bits from the path memory unit into the shift register. A certain number of bits at the shift-in end of this register are supplied as read address bits to the path memory unit. In a second aspect of the invention, a Viterbi decoding circuit has selectors that first select old path metric values and branch metric values, which are added or subtracted to produce candidate path metric values, then select the candidate path metric values, which are subtracted to produce a comparison result bit representing the sign of their difference. These additions and subtractions are performed by the same arithmetic unit.

19 Claims, 11 Drawing Sheets

FIG.4

TIME

|  |  | 0 | 1 | 2 | 3 | 4 | 5 |  | 83 | 84 | 85 | 86 | 87 | 88 |
|---|---|---|---|---|---|---|---|---|---|---|---|---|---|---|
| 00000 | (0) | 0 | 1 | 0 | 1 | 1 | 0 |  | 1 | 1 | 0 | 1 | 0 | 1 |
| 00001 | (1) | 1 | 0 | 1 | 0 | 0 | 0 |  | 0 | 0 | 1 | 0 | 0 | 0 |
| 00010 | (2) | 0 | 1 | 0 | 0 | 1 | 0 |  | 1 | 0 | 1 | 1 | 0 | 1 |
| 00011 | (3) | 0 | 0 | 1 | 0 | 0 | 0 |  | 0 | 0 | 0 | 0 | 0 | 0 |
| 00100 | (4) | 1 | 1 | 0 | 1 | 1 | 0 |  | 1 | 1 | 0 | 1 | 0 | 1 |
| 00101 | (5) | 1 | 0 | 1 | 0 | 1 | 0 |  | 1 | 1 | 0 | 0 | 1 | 0 |
| 00110 | (6) | 0 | 1 | 0 | 1 | 0 | 0 |  | 0 | 0 | 1 | 1 | 1 | 0 |
| 00111 | (7) | 0 | 0 | 0 | 1 | 0 | 0 |  | 1 | 0 | 0 | 0 | 0 | 1 |
| 01000 | (8) | 1 | 0 | 0 | 0 | 0 | 1 |  | 0 | 0 | 1 | 1 | 0 | 0 |
| 01001 | (9) | 1 | 1 | 0 | 1 | 1 | 1 |  | 1 | 1 | 1 | 0 | 0 | 1 |
| 01010 | (10) | 0 | 0 | 1 | 0 | 1 | 0 |  | 1 | 0 | 1 | 1 | 0 | 0 |
| 01011 | (11) | 1 | 0 | 0 | 1 | 0 | 0 |  | 1 | 1 | 0 | 0 | 1 | 0 |
| 01100 | (12) | 1 | 0 | 1 | 0 | 0 | 1 |  | 1 | 1 | 0 | 1 | 0 | 1 |
| 01101 | (13) | 0 | 0 | 1 | 1 | 1 | 0 |  | 0 | 0 | 1 | 0 | 0 | 0 |
| 01110 | (14) | 1 | 0 | 0 | 1 | 0 | 0 |  | 1 | 1 | 0 | 1 | 0 | 1 |
| 01111 | (15) | 0 | 1 | 0 | 1 | 0 | 0 |  | 0 | 0 | 1 | 0 | 0 | 0 |
| 10000 | (16) | 1 | 0 | 0 | 0 | 1 | 0 |  | 1 | 0 | 1 | 1 | 0 | 0 |
| 10001 | (17) | 0 | 0 | 1 | 0 | 0 | 1 |  | 1 | 1 | 0 | 0 | 0 | 1 |
| 10010 | (18) | 1 | 1 | 0 | 0 | 1 | 0 |  | 0 | 0 | 1 | 1 | 1 | 1 |
| 10011 | (19) | 0 | 1 | 1 | 1 | 0 | 0 |  | 0 | 1 | 1 | 0 | 0 | 1 |
| 10100 | (20) | 1 | 0 | 1 | 0 | 0 | 1 |  | 0 | 1 | 1 | 0 | 1 | 0 |
| 10101 | (21) | 1 | 0 | 1 | 1 | 1 | 1 |  | 1 | 0 | 1 | 0 | 0 | 1 |
| 10110 | (22) | 0 | 1 | 0 | 1 | 0 | 0 |  | 0 | 0 | 1 | 0 | 1 | 1 |
| 10111 | (23) | 0 | 0 | 0 | 1 | 0 | 0 |  | 0 | 0 | 0 | 0 | 0 | 0 |
| 11000 | (24) | 1 | 0 | 0 | 0 | 0 | 0 |  | 0 | 0 | 0 | 0 | 1 | 1 |
| 11001 | (25) | 1 | 1 | 0 | 1 | 0 | 1 |  | 1 | 1 | 1 | 0 | 1 | 0 |
| 11010 | (26) | 0 | 1 | 1 | 0 | 1 | 1 |  | 0 | 1 | 1 | 1 | 0 | 1 |
| 11011 | (27) | 1 | 1 | 0 | 1 | 1 | 1 |  | 1 | 0 | 1 | 0 | 1 | 1 |
| 11100 | (28) | 1 | 0 | 0 | 0 | 1 | 0 |  | 1 | 1 | 1 | 1 | 0 | 1 |
| 11101 | (29) | 1 | 0 | 1 | 1 | 1 | 0 |  | 0 | 0 | 1 | 0 | 0 | 1 |
| 11110 | (30) | 0 | 1 | 1 | 0 | 0 | 1 |  | 0 | 1 | 1 | 0 | 1 | 0 |
| 11111 | (31) | 0 | 1 | 1 | 0 | 1 | 1 |  | 0 | 1 | 0 | 1 | 0 | 0 |

STATE (row labels)

VITERBI DECODING METHOD AND CIRCUIT WITH ACCELERATED BACK-TRACING AND EFFICIENT PATH METRIC CALCULATION

BACKGROUND OF THE INVENTION

This invention relates to a method of carrying out the Viterbi algorithm for decoding convolutionally coded data, and a circuit for practicing this method.

Convolutional codes are employed in mobile communication systems ranging from cellular telephone networks to earth satellite systems. Briefly, a convolutional coder generates output bits from the k most recent input bits, where k is an integer referred to as the constraint length. The most recent k−1 of these bits identify what is called a state, with input of each new bit causing a transition to a new state. At any given time there are $2^{k-1}$ possible states.

The Viterbi decoding algorithm is a maximum-likelihood method that receives an encoded data sequence, then decides what inputs to the convolutional coder were most likely to have produced that sequence. More specifically, for each of the $2^{k-1}$ possible states at each time in the received sequence, one bit of information, called a comparison result bit, is stored to indicate which of two possible preceding states is more likely. This information can be used to trace a path from a given state to the most likely preceding state, then the most likely state preceding that state, and so on back in time. Each such path has an associated path metric value, which indicates how well the path matches the signal actually received. When an encoded sequence of a certain length has been received, the path metric values of paths leading back from all $2^{k-1}$ final states are compared, the most likely path is selected, and this path is retraced to obtain the decoded data.

Viterbi decoding is commonly practiced with a large-scale integrated circuit such as a digital signal processor (DSP) or similar processor, using general-purpose random-access memory (RAM) to store the comparison result bits and path metric values. The processor communicates with the RAM by transferring words of data over a data bus having a certain width. With a sixteen-bit bus, for example, words consisting of sixteen bits each are transferred, one complete word at a time.

In some cases the Viterbi decoding algorithm is practiced with a processor having special hardware for expediting the necessary calculations, such as a comparator for comparing two path metric values, or a shift register for assembling comparison result bits into words to be written into RAM. Data are still transferred to and from the RAM over a conventional data bus as described above, however.

A problem is that the conventional data bus is not well suited for handling bit data. To store one bit in the RAM, for example, it is necessary to read an entire word, modify the appropriate bit, then write the word back at the same address. Thus if comparison result bits are stored one at a time, a great deal of unnecessary data transfer must take place. Even if a shift register is used to assemble complete words, so that they can be written to RAM without the reading and modification steps, extra processing is still required to determine when a complete word has been assembled, and to execute the transfer from the shift register to RAM.

When individual bits are read from RAM over the data bus the situation is even worse. The desired bit is obtained as the Nth bit of a word of data. To determine whether the bit is a one or a zero, the processor must, for example, logically AND the word with a special mask word having a one in the Nth bit position and zeros in the other positions. Mask words must either be generated as needed, which takes time, or stored in and read from a separate table, which requires extra memory space. Alternatively, the processor can perform an N-bit left or right shift on the word read from RAM, then determine whether the most significant bit or least significant bit is a one or zero. The shift operation takes time, however, and may have to be followed by a further logic operation to mask bits other than the most significant or least significant bit to zero.

Some processors have special bit-manipulation instructions that enable the value of an arbitrary bit in a word to be obtained in one step. Even if such instructions are used, however, the processor must still calculate the position of the bit in the word, which requires the execution of other instructions. In short, reading an individual bit from a conventional RAM over a conventional data bus involves a great deal of extra processing and consumes much unnecessary time.

One possible solution to this problem is to store each comparison result bit in a separate word, in the least significant or most significant bit position, for example. This solution wastes considerable memory space, however, because only one bit per word is used.

When a path is being traced backwards as described above, starting from a given state at a given time, the processor must first calculate the address of the word storing the comparison result bit for that state and time, and the position the bit in that word. Then it must read the value of the comparison result bit. From the comparison result bit, the processor must next execute several instructions to calculate the value of the preceding state on the path, then repeat the entire process of address calculation, bit position calculation, bit reading, and state calculation again to get the next bit. The address and bit-position calculations are particularly troublesome if the data bus width is not equal to $2^{k-1}$. To deal with different cases, the calculations may require conditional branching instructions, which can take a particularly long time to execute.

When encoded data are received continuously, after receiving a sequence of a certain length, the processor must decode the sequence, by executing the above back-tracing operations, before it begins receiving the next sequence. The back-trace must therefore be completed quickly, but the many computations that are conventionally required, and the above-described problems associated with accessing bits in a conventional RAM over a conventional data bus, cause serious delays.

SUMMARY OF THE INVENTION

It is accordingly an object of the present invention to accelerate the back-tracing of paths in the Viterbi decoding process.

Another object of the invention is to provide compact hardware for carrying out the Viterbi decoding algorithm.

According to a first aspect of the invention, a Viterbi decoding circuit comprises:

a processor for computing comparison result bits;

a path memory unit for storing the comparison result bits at individual addresses; and a path trace register that receives a state value from the processor, then receives comparison result bits read from the path memory unit. The contents of the path trace register are shifted as each comparison result bit is received, so that the comparison result bits are successively appended to the state value. Part of the path trace register contents, including the most recently appended comparison result bit, is supplied to the path memory unit as part of the path memory unit's read address. After a certain number of comparison result bits have been shifted into the path trace register, path trace register contents are read out as decoded data.

According to a second aspect of the invention, a Viterbi decoding comprises:

registers for storing a pair of old path metric values and a pair of branch metric values;

a first selector for selecting the branch metric values in a first mode, and a first candidate path metric value in a second mode;

a second selector for selecting the old path metric values in the first mode, and a second candidate path metric value in the second mode;

an add-subtract-compare unit for adding the branch metric values to the old path metric values in the first mode to generate the first and second candidate path metric values, and subtracting one candidate path metric value from the other candidate path metric value in the second mode to generate a comparison result bit representing the sign of their difference;

a third selector for selecting the first or second candidate path metric value according to the comparison result bit; and a path metric memory, in which the selected candidate path metric value is stored.

BRIEF DESCRIPTION OF THE DRAWINGS

FIG. 4 illustrates a path in the path memory unit in FIG. 1.

DETAILED DESCRIPTION OF THE INVENTION

The invented circuit and method will be better understood from the following detailed descriptions of specific embodiments, given with reference to the attached illustrative drawings.

Figure 1:
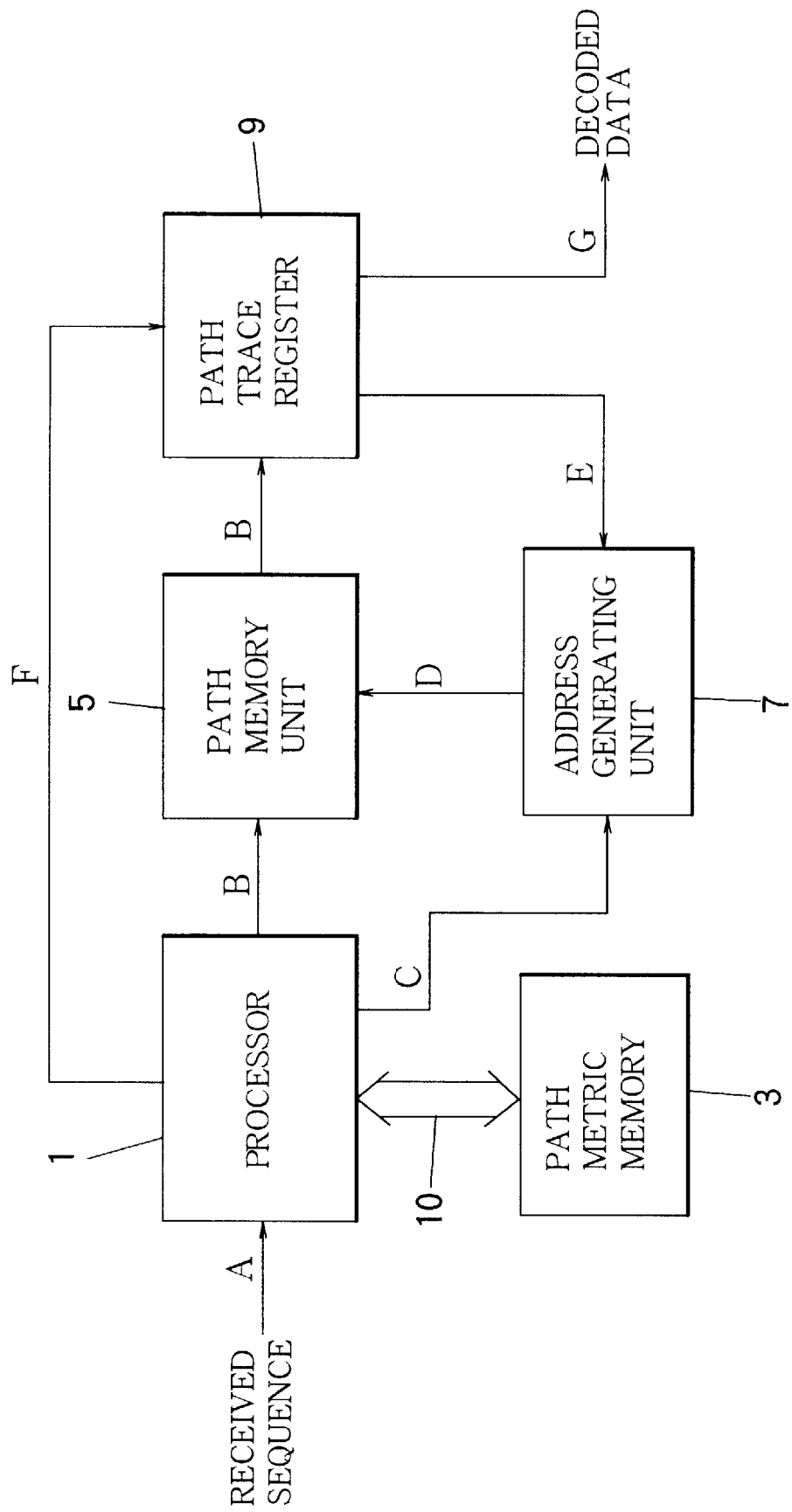
FIG. 1 is a block diagram of a first embodiment of the invention.

Referring to FIG. 1, a first embodiment of the invented Viterbi decoding circuit comprises a processor 1, a path metric memory 3, a path memory unit 5, an address generating unit 7, and a path trace register 9.

The processor 1 is, for example, a digital signal processor, microprocessor, or other computing device capable of processing a received sequence of input data (A). The path metric memory 3 is, for example, a conventional RAM, with which the processor 1 communicates over a conventional data bus 10.

The path memory unit 5 is a read-write memory circuit for storing comparison result bits B received from the processor 1, and outputting stored bits to the path trace register 9. The comparison result bits B are transported one bit at a time on special signal lines, and are not carried on the data bus 10. Each bit is stored at a separate address in the path memory unit 5. The path memory unit 5 preferably has separate read and write ports, the write port being coupled to the processor 1 and the read port to the path trace register 9, as illustrated.

The address generating unit 7 receives commands C from the processor 1 and outputs addresses D to the path memory unit 5, designating locations at which comparison result bits are to be stored and from which comparison result bits are to be read. In generating read addresses, the address generating unit 7 uses state values E obtained from the path trace register 9.

The path trace register 9 is a shift register that stores a state value F received from the processor 1, and appends comparison result bits B received from the path memory unit 5. The path trace register contents are shifted as each new comparison result bit is received. After a certain number of comparison result bits have been received, the contents of the path trace register 9 are output in the reverse of the received order as decoded data G.

The elements in FIG. 1 can be fabricated as a single integrated circuit, or as separate circuits. The path memory unit 5, address generating unit 7, and path trace register 9 may be added as novel enhancements to a processor of otherwise conventional design. Further details of the path memory unit 5, address generating unit 7, and path trace register 9 will be given later.

Next the process of computing comparison result bits will be described.

As noted earlier, a convolutional code with constraint length k has N states, where $N=2^{k-1}$. These states are naturally denoted by (k−1)-bit binary numbers representing values from zero to N−1. The state represented by a binary number J will be referred to as state J. A state transition is made by discarding the least significant bit of the state value and adding a new most significant bit.

In the following examples the constraint length k will be six, making N equal to thirty-two ($2^5$). State values will be shown as five-bit binary numbers.

Figure 2:
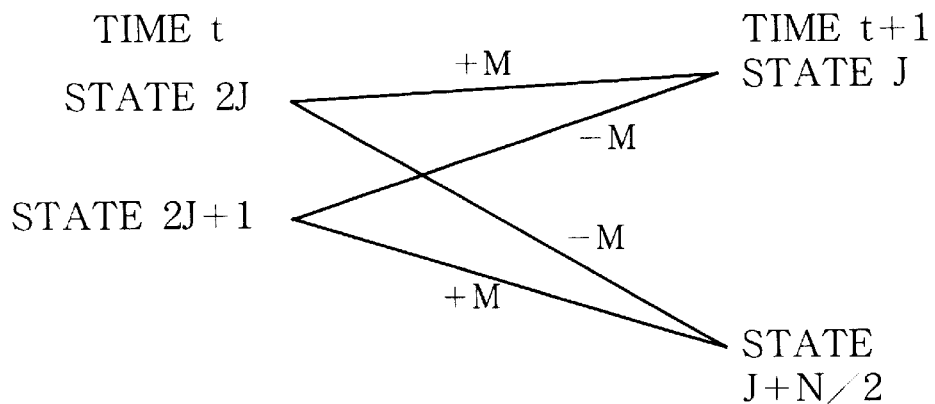
FIG. 2 is part of a trellis diagram illustrating state transitions.

FIG. 2 shows possible transitions from two states at time t to two states at time t+1. If the original bit input to the convolutional coder at time t+1 was a zero, state 2J and state 2J+1 at time t both become state J at time t+1. If the original bit was a one, states 2J and 2J+1 at time t both become state J+N/2 at time t+1. For example, if the state at time t is either 11010 (twenty-six) or 11011 (twenty-seven) and the next bit is a zero, a transition occurs to state 01101 (thirteen) at time t+1. If that next bit is a one, the transition is to state 11101 (twenty-nine, which equals thirteen plus sixteen).

Associated with each state transition is a branch metric value indicating how closely the transition matches the received data corresponding to time t+1. Various metrics can be used, such as Hamming distance or mean-square distance, but it is convenient to choose a metric having signed values that average out to zero, and this can be done in such a way that the branch metric values of the transitions in FIG. 2 are +M and −M.

The processor 1 maintains in the path metric memory 3 a set of N path metric values, one for each of the N possible states. At the end of the processing for time t, these path metric values pertain to paths terminating at the N states at time t. The path metric values of the two states at time t shown in FIG. 2 will be denoted $PM_t(2J)$ and $PM_t(2J+1)$.

Upon receiving the data for time t+1, the processor 1 calculates the branch metric values +M and −M, then proceeds to calculate new path metric values as follows. For a given state J ($0 \leq J < N/2$), the processor 1 first calculates two candidate path metric values A(J) and B(J):

$$A(J)=PM_t(2J)+(+M)$$

$$B(J)=PM_t(2J+1)+(-M)$$

A(J) is the metric value of a path leading through state 2J at time t to state J at time t+1. B(J) is the metric value of a path leading through state 2J+1 at time t to state J at time t+1.

Next the processor 1 compares A(J) and B(J) to decide which of these two paths is the more likely. The metric value, A(J) or B(J), of the more likely path is stored in the path metric memory 3 as the new path metric value $PM_{t+1}(J)$ of state J at time t+1, and a comparison result bit indicating which path was selected is output to the path memory unit 5.

Suppose, for example, that the more likely path is the one with the larger path metric value. If A(J)≧B(J), the processor 1 outputs A(J) as the new path metric value $PM_{t+1}(J)$, and "zero" as the comparison result bit. If A(J)<B(J), the processor 1 outputs B(J) as the new path metric value $PM_{t+1}(J)$, and "one" as the comparison result bit. The comparison result bit is the least significant bit of the state value at the preceding time t on the path, indicating the value of the bit that was discarded in the transition from time t to time t+1 on this path.

Next, since it has the path metric values $PM_t(2J)$ and $PM_t(2J+1)$ in hand, the processor 1 calculates two candidate path metric values leading to state J+N/2. For reasons that need not be gone into here, these two candidate path metric values are obtained by subtracting the branch metric values from the old path metric values $PM_t(2J)$ and $PM_t(2J+1)$, as follows:

$$C(J+N/2)=PM_t(2J)-(+M)$$

$$D(J+N/2)=PM_t(2J+1)-(-M)$$

These two candidate path metric values are compared to determine the more likely path, and its path metric value and a comparison result bit are output as before. For example, if C(J+N/2)≧D(J+N/2), then C(J+N/2) is output to the path metric memory 3 as the path metric value $PM_{t+1}(J+N/2)$, and a "zero" is output to the path memory unit 5 as the comparison result bit of state J+N/2 at time t+1. If C(J+N/2)<D(J+N/2), then D(J+N/2) is output to the path metric memory 3 as the path metric value $PM_{t+1}(J+N/2)$, and a "one" is output to the path memory unit 5 as the comparison result bit of state J+N/2 at time t+1.

After path metric values and comparison result bits have been found in this way for all states J at time t+1 (J=0, ..., N−1), the old path metric values $PM_t(J)$ are deleted from the path metric memory 3, leaving only the new path metric values $PM_{t+1}(J)$.

Figure 3:
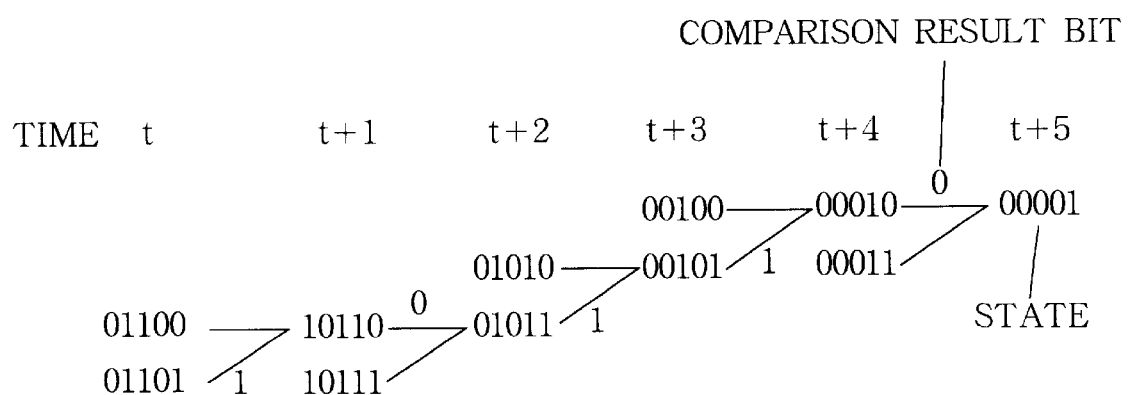
FIG. 3 illustrates a path in a convolutional code.

FIG. 3 illustrates how a path is built up, by showing transitions from a time t to a time t+5. At time t+1, in processing state 10110, the processor 1 considered the two possible transitions from states 01100 and 01101 at time t, selected the transition from state 01101 as the more likely, and stored a comparison result bit with the indicated value of "one." At time t+2, in processing state 01011, the processor 1 considered transitions from states 10110 and 10111 at time t+1, selected the transition from state 10110, and stored a comparison result bit with the value of "zero." Similarly, at times t+3, t+4, and t+5, transitions from states 01011, 00101, and 00010 to states 00101, 00010, and 00001 were selected, and comparison result bits with the indicated values of "one," "one," and "zero" were stored.

This path can be retraced from time t+5 back to time t by using the comparison result bits to reconstruct previous states. For example, from the state 00001 at time t+5 and the comparison result bit 0 for this state and time, the state at time t+4 can be reconstructed by appending the comparison result bit 0 to the state value 00001 (obtaining 000010) and removing the most significant bit (obtaining 00010). Similarly, appending the comparison result bit (1) of this state (00010) at time t+4 and removing the most significant bit gives 00101, which is the state at time t+3 on the path.

The comparison result bits themselves represent the original bits that were input to the convolutional coder. The comparison result bits for the most likely path are the desired decoded data.

How this back-tracing operation is carried out by the embodiment in FIG. 1 will be described below. It will be assumed that the back-trace is started when a sequence representing eighty-nine time steps, from an initial time t=0 to a final time t=88, has been received. Further structural details of the path memory unit 5, address generating unit 7, and path trace register 9 will now be given in preparation for this description.

Referring to FIG. 4, the path memory unit 5 stores 89×32 comparison result bit values. Each comparison result bit has a twelve-bit address, in which the seven high-order bits are a time value and the five low-order bits are a state value. The time values range from 0000000 (zero) to 1011000 (eighty-eight). The state values range from 00000 (zero) to 11111 (thirty-one). The address values accordingly range from 000000000000 (zero) to 101100011111 (two thousand eight hundred forty-seven).

In terms of physical structure, the path memory unit 5 is organized as a 1×2848-bit array of random-access memory cells, meaning that it has 2848 address locations, stores one bit per address, and is accessible one bit at a time at an arbitrary designated address. The path memory unit 5 is more easily visualized, however, as a 32×89 row-column array in which the rows represent different states and the columns different times, as shown in FIG. 4. State values are indicated in binary and decimal notation next to the rows, and time values in decimal notation above the columns.

FIG. 4 shows a typical set of comparison result bits that have been stored for all states and times from the initial time (t=0) to the final time (t=88).

Figure 5:
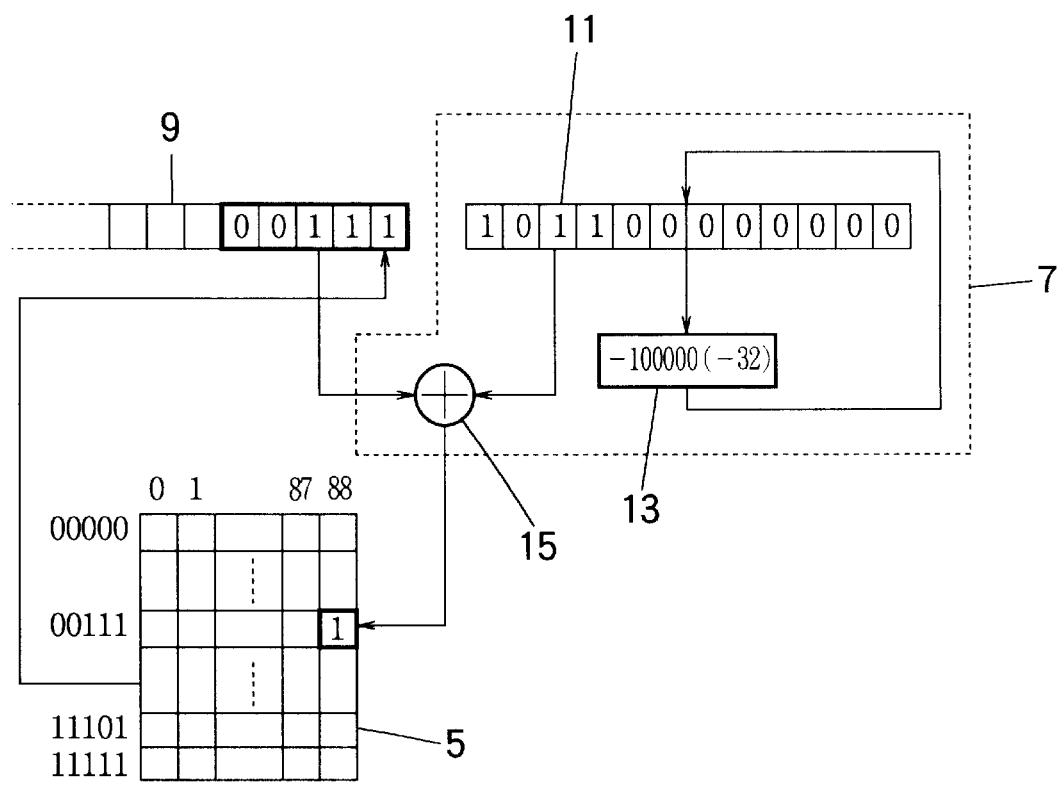
FIG. 5 illustrates an example of the structure of the address generating unit in FIG. 1.

Referring to FIG. 5, the address generating unit 7 comprises an address register 11, an address incrementer 13, and an address adder 15. The address register 11 stores a twelve-bit address. The address incrementer 13 increments this address by a programmable amount, which is designated by the processor 1. The address adder 15 adds the twelve-bit address in the address register 11 and a five-bit value obtained from the five low-order bits of the path trace register 9, and provides the resulting twelve-bit sum as an address to the path memory unit 5.

Figure 6:
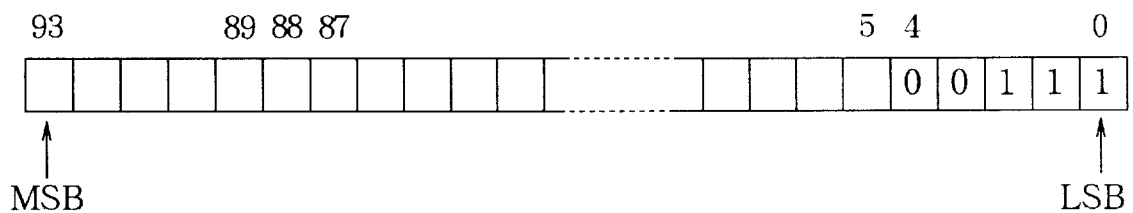
FIG. 6 illustrates the initial contents of the path trace register in FIG. 1 when the path in FIG. 4 is traced back.

Referring to FIG. 6, the path trace register 9 has enough bit cells to store a bit string comprising one bit value for each time step from the initial time to the final time, plus one additional state value. In the present embodiment, ninety-four cells (89+5) are required. In FIG. 6 the cells are numbered from cell zero at the least-significant-bit (LSB) end to cell ninety-three at the most-significant-bit (MSB) end. Cell numbers are shown over some of the bit cells.

The back-tracing procedure will now be described with reference to the flowchart in FIG. 7.

In the first step 17, the processor 1 loads 10110000000 as an initial value into the address register 11 in the address generating unit 7. The seven high-order bits of this initial address represent the final time value (1011000). The lower five bits (00000) are a dummy value. The processor 1 also programs the address incrementer 13 to increment the address register 11 by minus thirty-two, that is, to decrement the address register 11 by thirty-two. The decrement value is indicated in signed binary notation as −10000 in FIG. 5.

Figure 7:
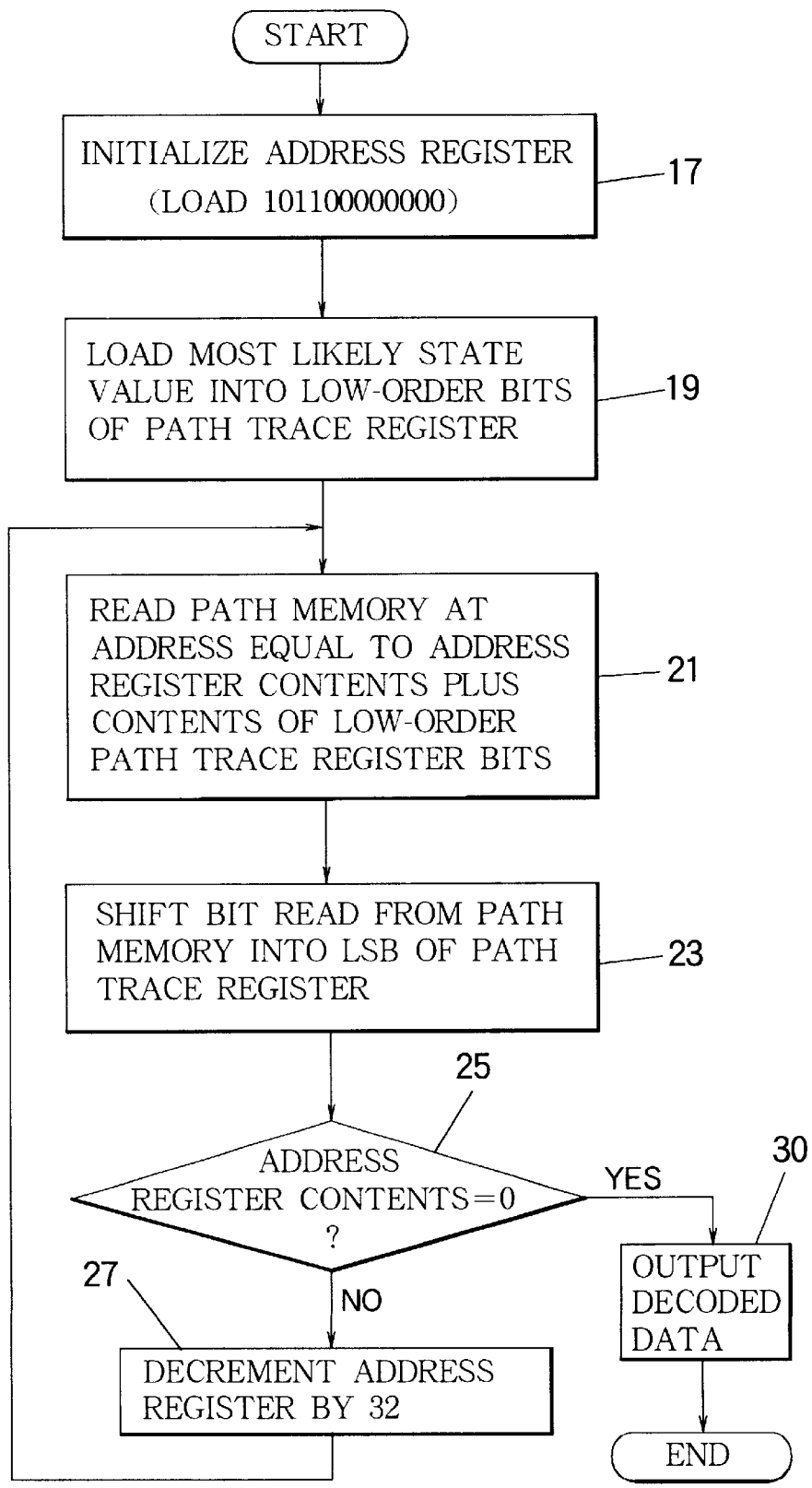
FIG. 7 is a flowchart of the back-tracing operation of the invented Viterbi decoding circuit.

In the next step 19 in FIG. 7, the processor 1 compares the thirty-two path metric values stored in the path metric memory 3 to find a state with, for example, the maximum path metric value, thus indicated to be the terminating state of a most likely path, and loads the state value of this state into the five low-order bits of the path trace register 9. As an example, in FIG. 6 state seven (00111) has been loaded into the five bit cells from bit four to bit zero (LSB).

In the next step 21, the address adder 15 in the address generating unit 7 adds the address-register contents (101100000000) and the contents (00111) of the five low-order path-trace-register bits to obtain an address (101100000111), and the path memory unit 5 is read at this address to obtain the comparison result bit that was stored for state seven (00111) at the final time (t=88).

In the next step 23, the comparison result bit read from the path memory unit 5 is shifted into the path trace register 9. The existing contents of the path trace register 9 are shifted one bit toward the MSB end, and the comparison result bit is loaded into the path trace register 9 at the LSB position.

Figure 8:
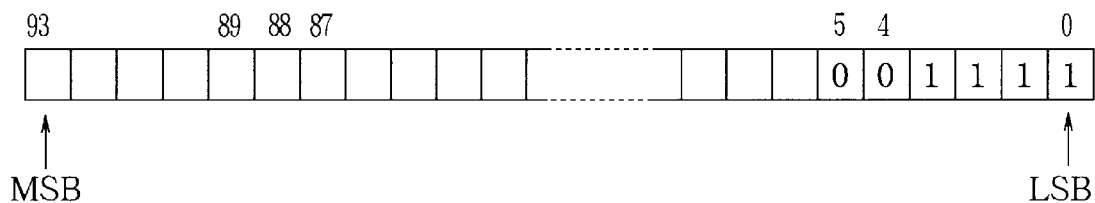
FIG. 8 illustrates the contents of the path trace register after tracing back one step.

Referring again to FIG. 4, the comparison result bit 24 stored for state seven (00111) at time t=88 is a "one." FIG. 8 shows the bit string in the path trace register 9 after this comparison result bit has been shifted in at the LSB position. The comparison result bit is appended to the low-order end of the existing state value 00111, producing the value 001111.

Referring again to FIG. 7, in the next step 25 the contents of the address register 11 in the address generating unit 7 are tested. The back-trace ends if the time value in the address register 11 represents the initial time, and continues if it does not. In the present example, the back-trace ends if the address register contents are zero, and continues if the address register contents are not zero.

Here the address register still contains the initial address 101100000000, so the back-trace process continues to the next step 27, which is to decrement the address register 11 by thirty-two, thereby decrementing the time value by one from eighty-eight (1011000) to eighty-seven (1010111). The address register 11 now contains 101011100000.

The process then loops back step 21, and steps 21 to 27 are repeated until the address register contents are found to be zero.

Figure 9:
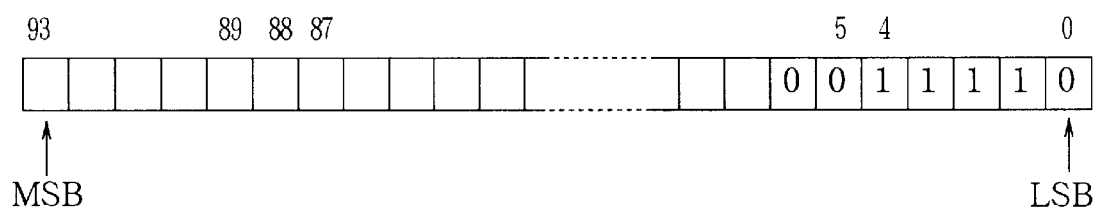
FIG. 9 illustrates the contents of the path trace register after tracing back another step.

At the first repetition, the address adder 15 adds the address-register contents, which now indicate time t=87, to the state value 01111 obtained from the low-order end of the path trace register 9, to read the comparison result bit stored in the path memory unit 5 for this time and state. (The read address 101011101111.) Referring to FIG. 4, this comparison result bit 28 is a "zero." Referring to FIG. 9, a "zero" is shifted into the path trace register 9 at the LSB position. The address register 11 is then decremented by thirty-two.

At the next repetition, the address register contents, now indicating time t=86, are added to the state value 11110 in the five low-order bits of the path trace register 9, and the path memory unit 5 is read at the resulting address (101011011110). Referring to FIG. 4, the comparison result bit 29 at this address is a "zero."

Figure 10:
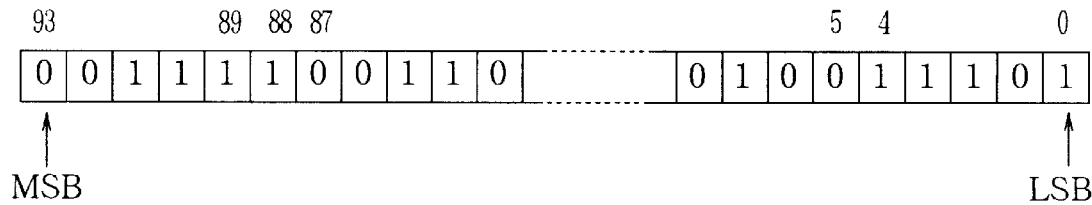
FIG. 10 illustrates the final contents of the path trace register.

The back-trace continues in this way, following the path indicated by arrows in FIG. 4 until the initial time t=0 is reached. At this point the path trace register 9 contains the data shown in FIG. 10. The state value 00111 that was initially set at the low-order end has been shifted into the five high-order bit cells (bits 89 to 93), while the comparison result bits read from the path memory unit 5 occupy the other bit cells (bits 0 to 88).

Referring again to FIG. 7, now that the address register 11 has been decremented to zero, the test in step 25 results in a branch to a final step 30 in which the decoded data are output. This can be done, for example, by shifting the stored bit string out from the LSB end of the path trace register 9; that is, by having the path trace register 9 execute ninety-four successive one-bit right shifts. Alternatively, these bits can be output in parallel to a buffer, not shown in the drawings.

Due to the nature of the Viterbi decoding algorithm, the reliability of the data in the path trace register 9 increases toward the LSB end. Accordingly, instead of outputting the entire stored bit string as decoded data, it is possible to output only a certain number of bits, starting at the LSB end, leaving the remaining part for final decoding after more data have been received. For example, only the first eighty-eight bits, in bit cells 0 to 87, could be output. Then in the next back-trace, time t=88 is treated as the initial time.

The above back-trace operations proceed quickly and require little intervention by the processor 1. The reading of comparison result bits from the path memory unit 5 into the path trace register 9 is driven by a clock signal (not shown), typically at a rate of one comparison result bit per clock cycle. All the processor 1 has to do is to initialize the address register 11, address incrementer 13, and path trace register 9 at the beginning of the back-trace, wait for the back-trace to end, then command the path trace register 9 to output the decoded data. The processor 1 can determine when the back-trace ends by counting clock cycles or monitoring the contents of the address register 11, or the address register 11 can be adapted to notify the processor 1 by means of an interrupt when the address value reaches the initial time.

A particular advantage of this embodiment is that the processor 1 does not have to perform any lengthy state, address, or bit-position calculations. State values are obtained directly from the five low-order bits of the path trace register 9. Read addresses are calculated in a fraction of a clock cycle by hardware in the address generating unit 7. No bit-position calculations are required at all, because the path memory unit 5 is coupled to the path trace register 9 by a single output line, and is accessed a bit at a time.

The address generating unit 7 can also be used to help the processor 1 generate write addresses for storing comparison result bits in the path memory unit 5. When storing comparison result bits for time t, for example, the processor 1 can initialize the address register 11 to indicate time t and state zero, program the address incrementer 13 to increment the address register 11 by one, thus incrementing the state value by one, and set sixteen (10000) in the five low-order bits of the path trace register 9. Addresses with state values of J and J+16 can then be produced by first disabling the address adder 15, so that the unmodified address register contents are supplied to the path memory unit 5, then enabling the address register 11, so that sixteen is added to the address register contents. After comparison result bits have been stored at these two addresses, the address incrementer 13 increments the address register 11. In this way addresses are produced for all state values from zero (00000) to thirty-one (11111).

Next a second embodiment of the invention will be described. This embodiment has a processor that has been adapted to speed up the calculation of path metric values.

Figure 11:
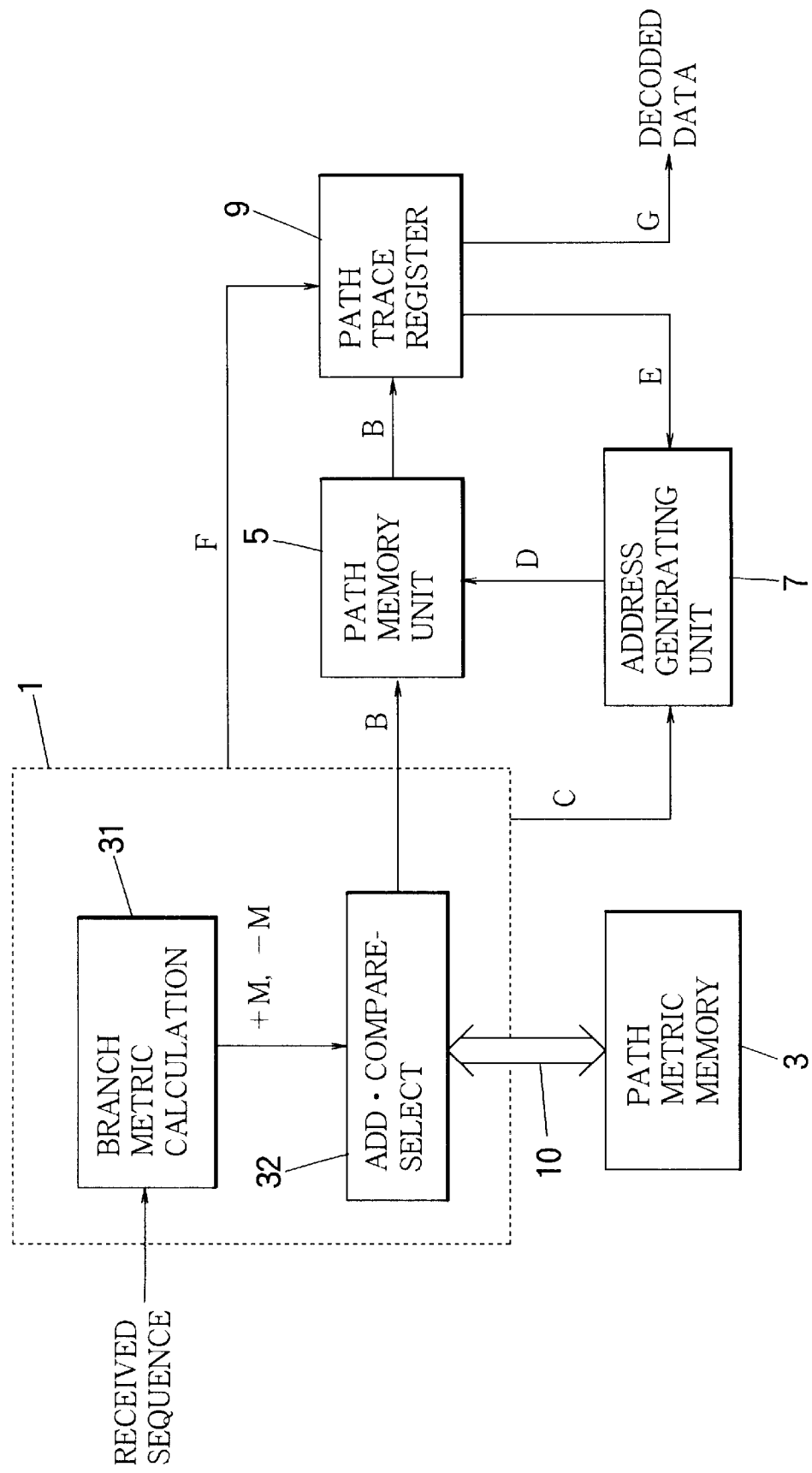
FIG. 11 is a general block diagram of a second embodiment of the invention.

Referring to FIG. 11, the second embodiment is identical to the first, except that the processor 1 is furnished with a branch metric calculation unit 31 and an add-compare-select unit 32. Other elements are denoted by the same reference numerals as in FIG. 1.

The branch metric calculation unit 31 calculates the branch metric values +M and −M. Since this calculation is performed only once per time step t, speed is not critical. The branch metric calculation unit 31 can accordingly be implemented in software.

The add-compare-select unit 32 adds the branch metric values +M and −M calculated by the branch metric calculation unit 31 to existing path metric values read from the path metric memory 3 (or subtracts them from the path metric values) to generate two candidate path metric values per state, compares these two candidate path metric values, and selects the more likely value, as described earlier. This process must be performed $2^{k-1}$ times per time step, so the branch metric calculation unit 31 is preferably implemented with special hardware. Two possible hardware configurations, one conventional and one novel, will be described next.

Figure 12:
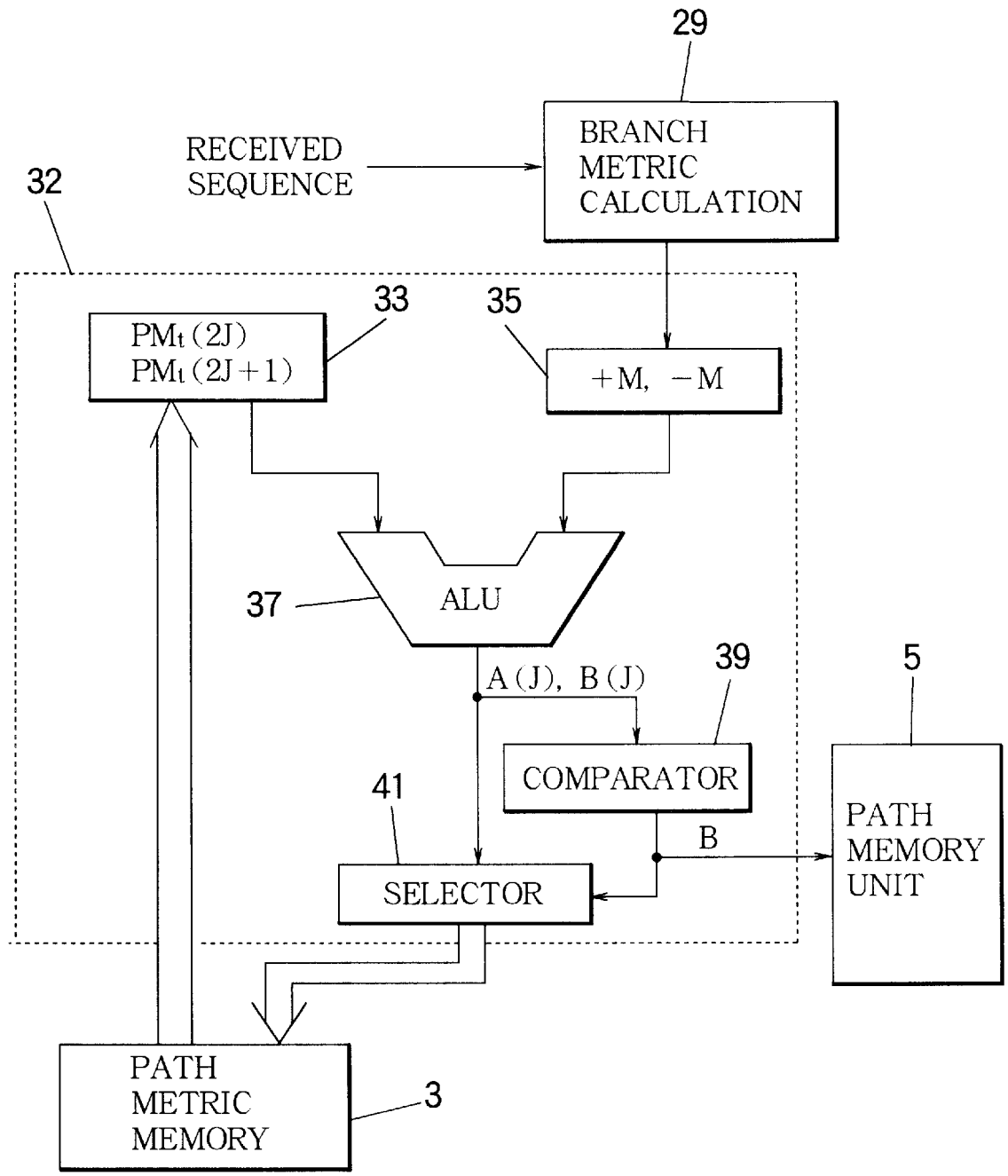
FIG. 12 is a block diagram illustrating a conventional configuration of the add-compare-select unit in FIG. 11.

FIG. 12 shows a conventional configuration of the add-compare-select unit 32. A path metric register pair 33 stores a pair of path metric values $PM_t(2J)$ and $PM_t(2J+1)$ for states 2J and 2J+1 at time t, which are read from the path metric memory 3. A branch metric register pair 35 stores the branch metric values +M and −M, which are obtained from the branch metric calculation unit 31.

To calculate a new path metric value for state J at time t+1, an arithmetic and logic unit (ALU) 37 adds +M to $PM_t(2J)$ and −M to $PM_t(2J+1)$. The two resulting sums A(J) and B(J) are supplied to a comparator 39 and selector 41 as candidate path metric values.

The comparator 39 compares A(J) and B(J) to find which is larger. Specifically, it subtracts one of these values from the other to get the sign bit of their difference. This sign bit is output to the path memory unit 5 and selector 41 as a comparison result bit B.

The selector 41 selects either A(J) or B(J) according to the comparison result bit B, and stores the selected value in the path metric memory 3 as the new path metric value $PM_{t+1}(J)$ of state J.

Next a new path metric value $PM_{t+1}(J+N/2)$ is obtained for state J+N/2. The process is similar except that the ALU 37 subtracts the branch metric values +M and −M from the path metric values $PM_t(2J)$ and $PM_t(2J+1)$, as described earlier.

It is possible to use existing registers and an existing arithmetic and logic unit in a conventional processor as the path and branch metric registers 33 and 35 and ALU 37. The add-compare-select unit 32 can accordingly be implemented by adding a new comparator 39 and selector 41 to a conventional processor, as has been done in the prior art. If the path memory unit 5, address generating unit 7, and path trace register 9 of the present invention are also added, the entire Viterbi decoding algorithm can be executed at very high speed.

The configuration of the add-compare-select unit 32 is inefficient, however, in that it uses separate hardware (the ALU 37 and comparator 39) to perform essentially similar operations (subtraction and comparison).

Figure 13:
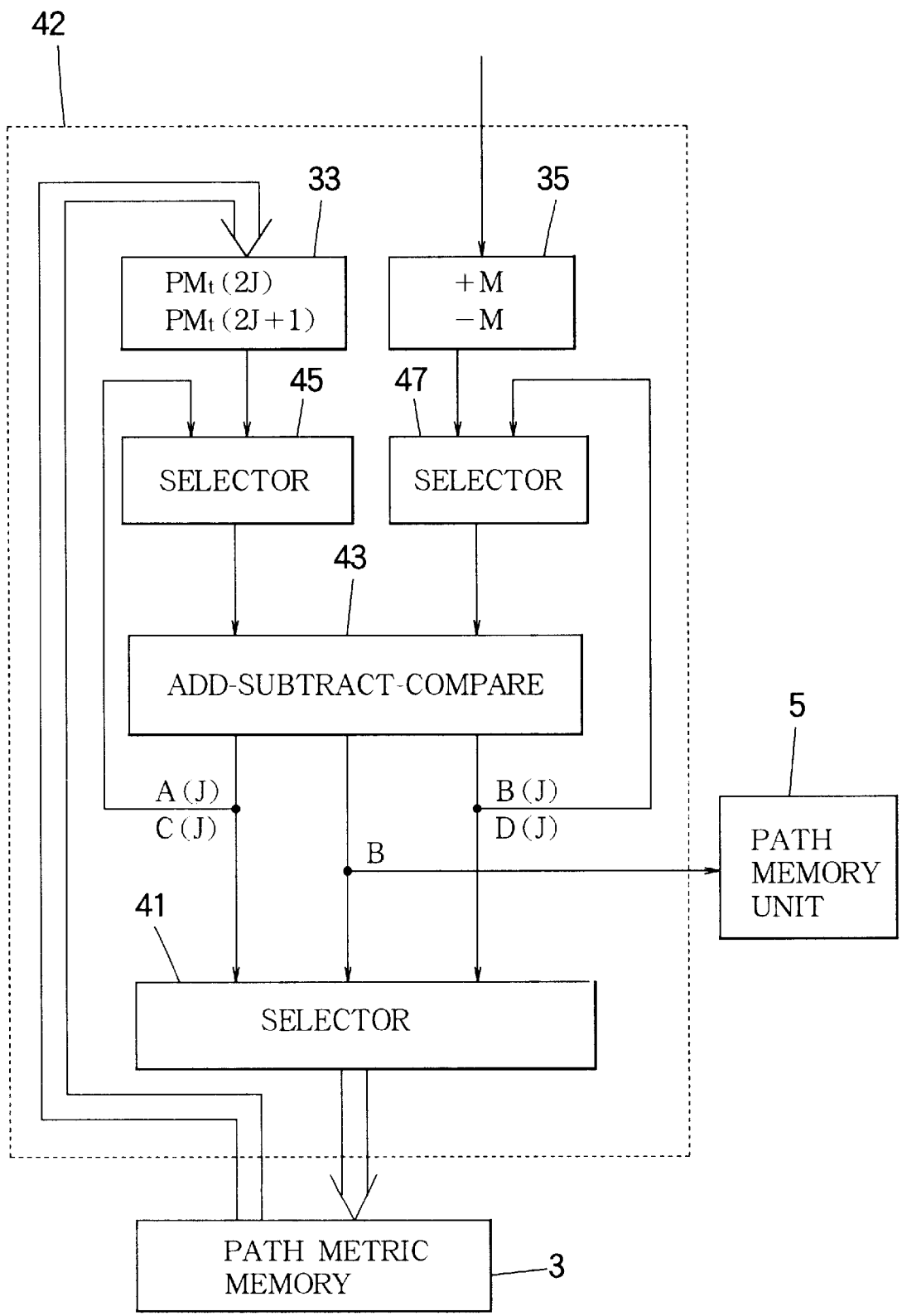
FIG. 13 is a block diagram illustrating a novel configuration of the add-compare-select unit in FIG. 11.

FIG. 13 shows a preferred configuration for the add-compare-select unit. The path and branch metric register pairs 33 and 35 and selector 41 in this novel add-compare-select unit 42 are identical to the path and branch metric register pairs and selector in the conventional add-compare-select unit 32, and have the same reference numerals as in FIG. 12. The ALU 37 and comparator 39 of FIG. 12 are replaced by a single add-subtract-compare unit 43 in FIG. 13, and additional selectors 45 and 46 are provided between this add-subtract-compare unit 43 and register pairs 33 and 35.

To calculate a new path metric value for state J, first selector 45 selects the old path metric values $PM_t(2J)$ and $PM_t(2J+1)$ in the path metric register pair 33, and selector 47 selects the branch metric values +M and −M in the branch metric register pair 35. The add-subtract-compare unit 43 adds +M to $PM_t(2J)$ and −M to $PM_t(2J+1)$ to obtain candidate path metric values A(J) and B(J), which are output to and stored in selector 41, and are also routed to selectors 45 and 47.

Next, selector 45 selects A(J) and selector 47 selects B(J), and the add-subtract-compare unit 43 is switched from add to subtract mode. The add-subtract-compare unit 43 subtracts B(J) from A(J) and outputs the sign bit of their difference as a comparison result bit B to the path memory unit 5 and selector 41. The selector 41 selects either A(J) or B(J) according to the value of the comparison result bit B, and stores the selected value as a new path metric value $PM_{t+1}(J)$ in the path metric memory 3.

To calculate a new path metric value for state J+N/2, the add-subtract-compare unit 43 is left in subtract mode, selector 45 again selects the old path metric values $PM_t(2J)$ and $PM_t(2J+1)$ in the path metric register pair 33, and selector 47 again selects +M and −M in the branch metric register pair 35. The add-subtract-compare unit 43 subtracts +M from $PM_t(2J)$ and −M from $PM_t(2J+1)$ to obtain candidate path metric values C(J+N/2) and D(J+N/2), which are stored in selector 41 and fed back to selectors 45 and 47.

Selectors 45 and 47 now select these two values C(J+N/2) and D(J+N/2), and the add-subtract-compare unit 43 subtracts D(J+N/2) from C(J+N/2) and outputs the sign bit of their difference as a comparison result bit B. Selector 41 selects C(J+N/2) or D(J+N/2) according to this comparison result bit B, and stores the selected value in the path metric memory 3 as $PM_{t+1}(J+N/2)$.

By having a single add-subtract-compare unit 43 perform the functions of both the ALU 37 and comparator 39 in FIG. 12, the add-compare-select unit 42 in FIG. 13 achieves a very efficient hardware configuration. Add, subtract, and compare operations are all carried out by a single unit 43 on a time-sharing basis.

The arithmetic and logic unit in a conventional processor can be employed as the add-subtract-compare unit 43. The novel add-compare-select unit 42 can accordingly be implemented by adding selectors 41, 45, and 47 to a conventional processor, without the need for a separate comparator.

Figure 14:
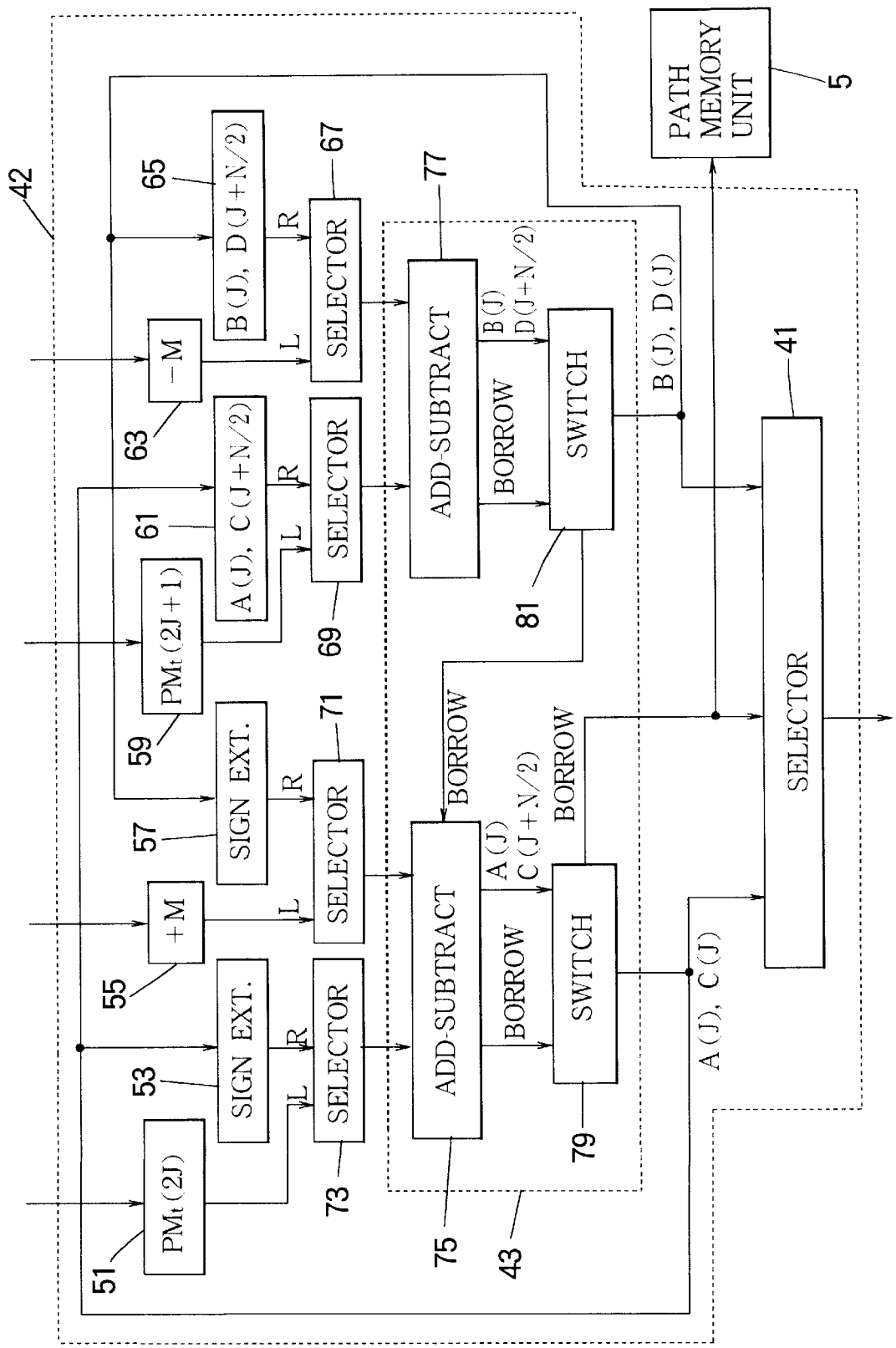
FIG. 14 is a more detailed block diagram of the add-subtract-compare unit in FIG. 13.

FIG. 14 shows one possible configuration of the add-subtract-compare unit 43 in more detail. As the path and branch metric register pairs 33 and 35 and selectors 45 and 47 in FIG. 13, the add-compare-select unit 42 in FIG. 14 has a set of eight registers 51, 53, 55, 57, 59, 61, 63, and 65, which store the values indicated in the drawing, and a set of four selectors 71, 73, 75, and 77, which select values in these registers as shown. Register 53 stores a sign extension of the value A(J) or C(J+N/2) in register 61; that is, the sign bit in register 61 is copied to all bit positions of register 53. Register 57 stores a similar sign extension of the value B(J) or D(J+N/2) in register 65.

The add-subtract-compare unit 43 comprises a pair of add-subtract units 75 and 77, and a pair of switches 79 and 81. The switches 79 and 81 route arithmetic result data A(J), B(J), C(J+N/2), and D(J+N/2) and carry/borrow bits, indicated in the drawing as borrow bits, from the add-subtract units 75 and 77 to the selector 41 and registers 53, 57, 61, and 65. The borrow bit from add-subtract unit 77 is routed to add-subtract unit 75.

To calculate a new path metric value for state J, first the selectors 67, 69, 71, and 73 are set to select the inputs marked L in the drawing, the add-subtract units 75 and 77 are set to add mode, and the switches 79 and 81 are set to enable output of the arithmetic results and disable output of the borrow bits. Accordingly, add-subtract unit 75 adds $PM_t(2J)$ and +M to obtain A(J), add-subtract unit 77 adds $PM_t(2J+1)$ and −M to obtain B(J), switch 79 sends A(J) to selector 41 and registers 53 and 61, and switch 81 sends B(J) to selector 41 and registers 57 and 65.

Next, the selectors 67, 69, 71, and 73 are set to select the inputs marked R, the add-subtract units 75 and 77 are set to subtract mode, and the switches 79 and 81 are set to disable output of the arithmetic results and enable output of the borrow bits. Accordingly, add-subtract units 75 and 77 cooperatively subtract B(J) from A(J), add-subtract unit 77 subtracting the low-order bits and add-subtract unit 75 the high-order bits, which are a sign extension of the low order bits. If add-subtract unit 77 generates a borrow, a borrow bit with a value of "one" is routed through switch 81 to add-subtract unit 75, to be subtracted there. The borrow bit output by add-subtract unit 75 indicates the sign of the difference A(J)−B(J), and is sent by switch 79 to the path memory unit 5 and selector 41 as a comparison result bit. Selector 41 selects A(J) or B(J) according to the value of the comparison result bit, for output to the path metric memory 3 in FIG. 13.

To calculate a new path metric value for state J+N/2, the same operations are performed except that the add-subtract units 75 and 77 are left in subtract mode throughout, so that they subtract +M and −M from $PM_t(2J)$ and $PM_t(2J+1)$ to obtain C(J+N/2) and D(J+N/2). The switches 79 and 81 place these values (and their sign extensions) in registers 53, 57, 61, and 65, then the add-subtract units 75 and 77 subtract them and output a borrow bit as a comparison result bit, indicating the sign of the difference C(J+N/2)−D(J+N/2).

The switching of the add-subtract units 75 and 77 between add and subtract modes and the operations of the selectors 67, 69, 71, 73 and switches 79 and 81 can be controlled by software, or more simply by a pair of clock signals. One clock signal, with a 50% duty cycle, controls the selectors and switches. Responding to this clock signal, the selectors alternate between selection of their L and R inputs, and the switches alternate between output of arithmetic results and borrow bits. The other clock signal, with a 75% duty cycle, controls the add-subtract units, placing them in add mode to obtain A(J) and B(J) and in subtract mode at other times.

Many conventional digital signal processors and other processors have two arithmetic and logic units that operate in parallel, which can be employed as the add-subtract units 75 and 77. The add-compare-select unit 42 in FIG. 14 can accordingly be implemented by adding selectors and switches to such a processor, and making the interconnections shown in FIG. 14. The Viterbi decoding algorithm can then be executed at high speed in a very compact and efficient hardware configuration.

Figure 15:
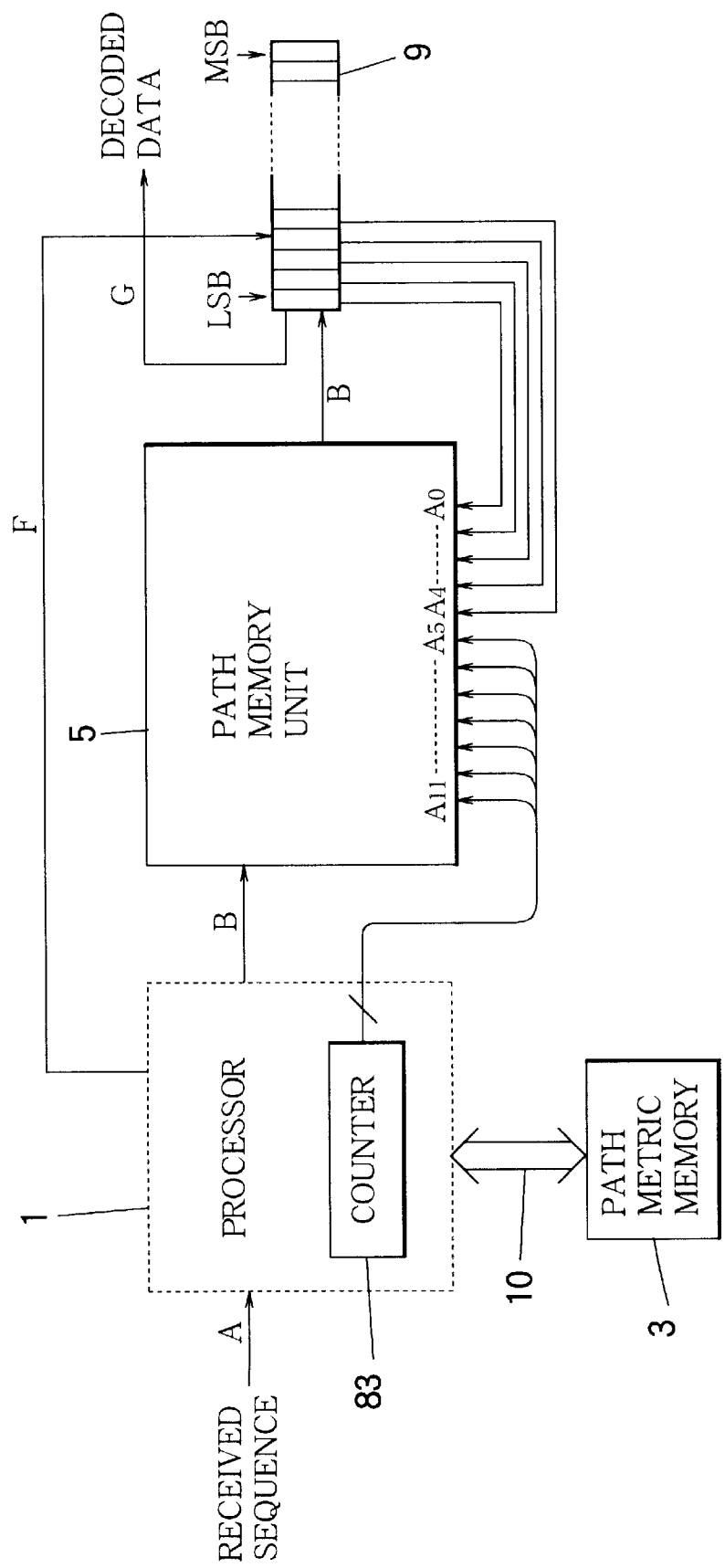
FIG. 15 is a block diagram of a third embodiment of the invention.

FIG. 15 illustrates a third embodiment of the invention, using the same reference numerals as in FIG. 1 to indicate identical elements. In this embodiment the processor 1 is adapted to enable fast back-tracing without the need for a separate address generating unit 7.

The path memory unit 5 has address input terminals $A_0$ to $A_{11}$ at which address signals are input. $A_0$ receives the least significant address bit, and $A_{11}$ the most significant bit. The five low-order address input terminals $A_0$ to $A_4$ are coupled to the five low-order bit cells in the path trace register 9, and receive the bit values in these cells. The seven high-order address input terminals $A_5$ to $A_{11}$ are coupled to a counter 83 in the processor 1.

To begin a back-trace, the processor 1 initializes the counter 83 to the final time value (e.g. 1011000) and sets a most likely final state value (e.g. 00111) in the path trace register 9. These values generate the address (e.g. 101100000111) of the comparison result bit for this most likely state at the final time, and this comparison result bit is shifted from the path memory unit 5 into the path trace register 9.

Next, the counter 83 is decremented to reduce the time value step by step, and the same process is repeated. The comparison result bits B of the most likely path are shifted into the path trace register 9 as in the first embodiment. When the counter 83 reaches the initial time (e.g. zero), the bit string stored in the path trace register 9 (or part of this bit string) can be shifted out in reverse order as decoded data G.

The address signal interconnections shown in FIG. 15 are used only for generating read addresses. When comparison result bits are written in the path memory unit 5, the inputs to the five low-order address input terminals $A_0$ to $A_4$ are switched over to, for example, outputs from another counter in the processor 1.

Programmable counters are provided in many conventional processors, so the third embodiment can be implemented by adding a path memory unit 5 and path trace register 9 and furnishing the necessary interconnections. The third embodiment provides the same acceleration of the back-tracing process as the first embodiment, with less additional hardware.

Many more embodiments of the invention are readily conceivable in addition to those described above. For example, the processor 1 can be provided with both an add-compare-select unit 32 or 42 and a counter 83 to combine the features of the second and third embodiments.

Some of the operations that have been described as being carried out by hardware can also be performed by software. The decrement operation carried out by the address incrementer 13 in FIG. 5, for example, can be performed by an instruction that decrements a register (used as the address register 11) in the processor 1. The conventional arithmetic and logic unit in the processor 1 can also be employed as the address adder 15, so that the entire address generating unit 7 is implemented using existing processor facilities.

The address adder 15 in FIG. 5 can be replaced by an address combining unit that concatenates the time value in the address register 11 with the state value obtained from the path trace register 9.

The novel add-compare-select unit 42 in FIGS. 13 and 14 can be employed even without the novel path memory unit 5 and path trace register 9.

The path memory unit 5 can be a larger array of memory cells than shown in FIG. 4, leaving room to store additional comparison result bits as more data are received.

Comparison result bits can be output from the processor 1 on a particular one of the data bus lines, and input to the path memory unit 5 via a special signal line branched from that data bus line.

The path and branch metric values need not be signed values; unsigned metrics can be employed. In this case all candidate path metric values will be obtained by adding branch metric values to previous path metric values.

In FIG. 14, the subtraction of candidate path metric values can be performed by just one of the two add-subtract units 75 and 77, the resulting borrow bit or sign bit being output as the comparison result bit B.

Applications of the present invention are not limited to cellular telephone networks and satellite communications; they extend to any type of communication system or information-processing system that employs a convolutional code, of any constraint length.

Those skilled in the art will recognize that the scope claimed below includes many more possible variations on the embodiments described above.

What is claimed is:

1. A Viterbi decoding circuit for decoding a convolutional code, comprising:

a processor for generating comparison result bits indicating transitions between states in said convolutional code, wherein said processor has a counter for providing a part of a designated said read address;

a path memory unit coupled to said processor, for storing each comparison result bit generated by said processor at a designated write address, and outputting a comparison result bit thus stored from said designated read address; and a path trace register having a plurality of bit cells for storing bits, coupled in series from a first bit cell to a last bit cell, said first bit cell being coupled to said path memory unit, for storing a state value of one of said states received from said processor in a certain number of contiguous bit cells including said first bit cell, then receiving comparison result bits read from said path memory unit at said first bit cell, thus vacating said first bit cell, and storing the received comparison result bit in said first bit cell, shifting contents of said bit cells in a direction from said first bit cell toward said last bit cell, as each comparison result bit is received, for providing contents of said certain number of contiguous bit cells including said first bit cell to said path memory unit as part of said read address, and for outputting contents of at least some of said bit cells as decoded data.

2. A Viterbi decoding circuit for decoding a convolutional code, comprising:

a processor for generating comparison result bits indicating transitions between states in said convolutional code;

a path memory unit coupled to said processor, for storing each comparison result bit generated by said processor at a designated write address, and outputting a comparison result bit thus stored from a designated read address;

a path trace register having a plurality of bit cells for storing bits, coupled in series from a first bit cell to a last bit cell, said first bit cell being coupled to said path memory unit, for storing a state value of one of said states received from said processor in a certain number of contiguous bit cells including said first bit cell, then receiving comparison result bits read from said path memory unit at said first bit cell, thus vacating said first bit cell, and storing the received comparison result bit in said first bit cell, shifting contents of said bit cells in a direction from said first bit cell toward said last bit cell, as each comparison result bit is received, for providing contents of said certain number of contiguous bit cells including said first bit cell to said path memory unit as part of said read address, and for outputting contents of at least some of said bit cells as decoded data; and an address generating unit coupled to said path trace register, wherein said address generating unit has:
   an address register; and
   an address combiner for combining contents of said address register with said contents of said certain number of contiguous bit cells, and providing the contents thus combined to said path memory unit as said read address.

3. The decoder of claim 2, wherein said address generating unit also has an address incrementer for incrementing and decrementing said address register.

4. The decoder of claim 2, wherein said address combiner adds said contents of said address register to said contents of said certain number of contiguous bit cells.

5. A Viterbi decoder for decoding convolutionally encoded data by computing branch metric values of transitions from previous states to current states according to currently received data, adding said branch metric values to path metric values of said previous states to obtain two path metric values for each current state, selecting a most likely transition to each current state according to said two path metric values, generating a comparison result bit to indicate the selected transition, repeating this process as data are received from an initial time to a final time, then selecting a most likely state at said final time and outputting decoded data by retracing a path from said most likely state, comprising:

a path memory unit with a write function for receiving each said comparison result bit when generated and storing said comparison result bit at a designated address, and a read function for outputting the comparison result bit stored at a designated address;

a path trace register with a first end and a second end, said first end being coupled to said path memory unit, for storing a state value designating said most likely state at said first end, receiving comparison result bits read from said path memory unit at said first end, shifting said state value and said comparison result bits from said first end toward said second end, thereby appending said comparison result bits to said state value, and providing at least some of the comparison result bits thus appended as decoded data; and an address generating unit coupled to said path memory unit, for reading a certain number of bits at said first end of said path trace register, and generating from these bits an address from which to read a comparison result bit from said path memory unit for storage in said path trace register.

6. The decoder of claim 5, wherein said path memory unit stores just one comparison result bit at each said address.

7. The decoder of claim 5, wherein each said address comprises a time value designating a time from said initial time to said final time and a state value designating one of said states, said state value consists of said certain number of bits read from said path trace register, and said address generating unit has:

an address register for storing said time value;

an address modification unit for modifying the time value in said address register so that said time value designates successive times in reverse order from said final time to said initial time; and an address combiner for combining the time value in said address register with the state value read from said path trace register to generate said address from which to read a comparison result bit from said path memory unit.

8. The decoder of claim 7, wherein said address combiner adds said state value to said time value.

9. The decoder of claim 7, wherein said address combiner concatenates said state value with said time value.

10. The decoder of claim 5, also comprising:

an arithmetic and logic unit for adding said branch metric values to said path metric values of previous states to compute said two path metric values for each current state;

a comparator for comparing said two path metric values as computed by said arithmetic and logic unit and generating said comparison result bit; and a selector for selecting one of said two path metric values according to said comparison result bit.

11. The decoder of claim 5, also comprising:

an add-subtract-compare unit for adding said branch metric values to said path metric values of previous states to compute said two path metric values for each current state, outputting said two path metric values, then subtracting one of said two path metric values from another one of said two path metric values to determine a sign of their difference, and outputting said comparison result bit according to said sign; and a selector for selecting one of said two path metric values according to said comparison result bit.

12. A Viterbi decoding circuit for decoding a convolutional code by generating branch metric values and path metric values and selecting a most likely path according to said path metric values, comprising:

a path metric memory for storing said path metric values;

a path metric register pair coupled to said path metric memory, for storing a pair of old path metric values read from said path metric memory;

a branch metric register pair, for storing a pair of branch metric values;

a first selector, coupled to said branch metric register pair and operating in a first mode and a second mode, for providing output of said branch metric values in said first mode and output of a first candidate path metric value in said second mode;

a second selector, coupled to said path metric register pair and operating in said first mode and said second mode, for providing output of said old path metric values in said first mode and output of a second candidate path metric value in said second mode;

an add-subtract-compare unit coupled to said first selector and said second selector, for adding said branch metric values to said old path metric values in said first mode, thereby generating said first candidate path metric value and said second candidate path metric value, and for performing a subtraction operation on said first candidate path metric value and said second candidate path metric value in said second mode, thereby generating a comparison result bit representing a sign of their difference; and a third selector coupled to said add-subtract-compare unit, for selecting one candidate path metric value from among said first candidate path metric value and said second candidate path metric value, responsive to said comparison result bit, and storing the candidate path metric value thus selected in said path metric memory as a new path metric value.

13. The decoder of claim 12, wherein said add-subtract-compare unit comprises:

a first add-subtract unit for performing addition on one of said branch metric values and one of said old path metric values to obtain said first candidate path metric value, and performing subtraction on low-order bits of said first candidate path metric value and said second candidate path metric value to obtain a borrow bit;

a second add-subtract unit for performing addition on another one of said branch metric values and another one of said old path metric values to obtain said second candidate path metric value, and performing subtraction on high-order bits of said first candidate path metric value and said second candidate path metric value, using said borrow bit, to obtain said comparison result bit;

a first switch coupled to said first add-subtract unit, for supplying said first candidate path metric value to said first selector, said second selector, and said third selector in said first mode, and supplying said borrow bit to said second add-subtract unit in said second mode; and a second switch coupled to said second add-subtract unit, for supplying said second candidate path metric value to said first selector, said second selector, and said third selector in said first mode, and supplying said comparison result bit to said third selector in said second mode.

14. The decoder of claim 13, wherein said high-order bits of said first candidate path metric value and said second candidate path metric value are sign extensions of said low-order bits of said first candidate path metric value and said second candidate path metric value.

15. A method of decoding a convolutional code by backtracing a path in an array of bits addressed by a time value representing a step of time and a state value representing a state of said convolutional code, in which a bit addressed by a particular time value and a particular state value in said array selects one of two possible state values at a preceding time, comprising the steps of:

(a) selecting a most likely state at said final time;

(b) initializing a bit string having a first end and a second end to the state value of said most likely state;

(c) initializing said time value to a final time;

(d) reading a certain number of bits at said first end of said bit string as a current state value;

(e) reading from said array of bits the bit addressed by said time value and said current state value;

(f) appending the bit read in said step (e) to said bit string at said first end of said bit string, so that said bit read in said step (e) will become one of the bits read in a later repetition of said step (d);

(g) modifying said time value to indicate a time one step closer to said initial time;

(h) repeating the steps from said step (d) to said step (g) until said time value indicates an initial time; and (i) outputting at least part of said bit string as decoded data.

16. The method of claim 15, wherein said bit string is stored in a shift register, and said step (f) comprises shifting said bit into said shift register.

17. The method of claim 15, wherein said array of bits is stored in a memory unit that is accessed one bit at a time.

18. The method of claim 15, wherein said convolutional code has a constraint length one bit longer than said certain number of bits.

19. The method of claim 15, wherein said part of said bit string extends from said first end toward said second end.

* * * * *